(12) United States Patent
Colgan et al.

(10) Patent No.: US 7,473,102 B2
(45) Date of Patent: Jan. 6, 2009

(54) SPACE TRANSFORMING LAND GRID ARRAY INTERPOSERS

(75) Inventors: Evan George Colgan, Chestnut Ridge, NY (US); Paul W. Coteus, Yorktown, NY (US); Hubert Harrer, Schoenaich (DE); Gareth Geoffrey Hougham, Ossining, NY (US); John Harold Magerlein, Yorktown Heights, NY (US); John Torok, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/395,355

(22) Filed: Mar. 31, 2006

(65) Prior Publication Data

US 2007/0232090 A1   Oct. 4, 2007

(51) Int. Cl.
  *H01R 12/00* (2006.01)
(52) U.S. Cl. .................................... 439/66; 439/591
(58) Field of Classification Search .................. 439/66, 439/591, 638, 350
  See application file for complete search history.

(56) References Cited

U.S. PATENT DOCUMENTS

| | | | | |
|---|---|---|---|---|
| 3,813,773 | A | * | 6/1974 | Parks .......................... 29/830 |
| 4,998,885 | A | * | 3/1991 | Beaman ........................ 439/66 |
| 5,177,594 | A | * | 1/1993 | Chance et al. .............. 257/678 |
| 5,267,867 | A | | 12/1993 | Agahdel et al. ............... 439/73 |
| 5,599,595 | A | * | 2/1997 | McGinley et al. ............. 428/33 |
| 5,639,989 | A | * | 6/1997 | Higgins, III ................. 174/386 |
| 5,658,158 | A | * | 8/1997 | Milan ......................... 439/214 |
| 5,713,744 | A | * | 2/1998 | Laub ............................ 439/71 |
| 5,788,521 | A | * | 8/1998 | Milan ......................... 439/214 |
| 5,949,654 | A | * | 9/1999 | Fukuoka ..................... 361/760 |
| 5,953,213 | A | * | 9/1999 | Napierala ................... 361/760 |
| 6,132,220 | A | | 10/2000 | McHugh et al. .............. 439/66 |
| 6,188,028 | B1 | * | 2/2001 | Haba et al. .................. 174/266 |
| 6,204,681 | B1 | * | 3/2001 | Nagatsuka et al. .......... 324/761 |
| 6,271,482 | B1 | | 8/2001 | Crotzer et al. .............. 174/262 |
| 6,286,208 | B1 | * | 9/2001 | Shih et al. ..................... 29/879 |
| 6,312,266 | B1 | | 11/2001 | Fan et al. ...................... 439/91 |
| 6,345,989 | B1 | * | 2/2002 | Mason et al. .................. 439/74 |
| 6,348,659 | B1 | | 2/2002 | Crotzer et al. ............. 174/68.1 |
| 6,354,844 | B1 | * | 3/2002 | Coico et al. ................... 439/66 |

(Continued)

FOREIGN PATENT DOCUMENTS

WO   WO 2005/018296 A1   2/2005

*Primary Examiner*—Tho D. Ta
*Assistant Examiner*—Travis Chambers
(74) *Attorney, Agent, or Firm*—F. Chau & Associates, LLC

(57) ABSTRACT

An electronic apparatus includes first and second level package structures and an LGA (land grid array) interposer. The first level package structure includes a package substrate, one or more integrated circuit chips mounted on a first surface of the package substrate, and a first pattern of I/O contacts with pitch P1 formed on a second surface of the package substrate opposite the first surface. The second level package structure includes a second pattern of I/O contacts with pitch P2, wherein P2 is not equal to P1. The LGA interposer is disposed between the first and second level package structures and provides space transform electrical interconnections between the first second patterns of I/O contacts, and further includes a dummy contact formed on at least a first or second surface of the LGA interposer and aligned to an LGA contact on an opposing surface of the LGA interposer.

14 Claims, 8 Drawing Sheets

U.S. PATENT DOCUMENTS

| | | | | |
|---|---|---|---|---|
| 6,396,000 B1* | 5/2002 | Baum | | 174/261 |
| 6,529,023 B2 | 3/2003 | Becker et al. | | 324/754 |
| 6,663,399 B2 | 12/2003 | Ali et al. | | 439/66 |
| 6,759,741 B2* | 7/2004 | Kline | | 257/727 |
| 6,790,057 B2 | 9/2004 | DelPrete et al. | | 439/91 |
| 6,824,396 B2 | 11/2004 | Koopman et al. | | 439/71 |
| 7,114,961 B2* | 10/2006 | Williams | | 439/66 |
| 7,247,035 B2* | 7/2007 | Mok et al. | | 439/81 |
| 7,252,515 B2* | 8/2007 | Brodsky et al. | | 439/66 |
| 2003/0067755 A1* | 4/2003 | Haimerl et al. | | 361/773 |
| 2004/0016114 A1 | 1/2004 | McAllister et al. | | 29/830 |
| 2004/0159915 A1 | 8/2004 | McAllister et al. | | 257/629 |
| 2004/0163252 A1* | 8/2004 | Khandros et al. | | 29/884 |
| 2004/0252477 A1 | 12/2004 | Brown et al. | | 361/830 |
| 2005/0014396 A1 | 1/2005 | Harper, Jr. | | 439/66 |
| 2005/0025434 A1 | 2/2005 | Benner et al. | | 385/88 |
| 2007/0245553 A1* | 10/2007 | Chong et al. | | 29/843 |

* cited by examiner

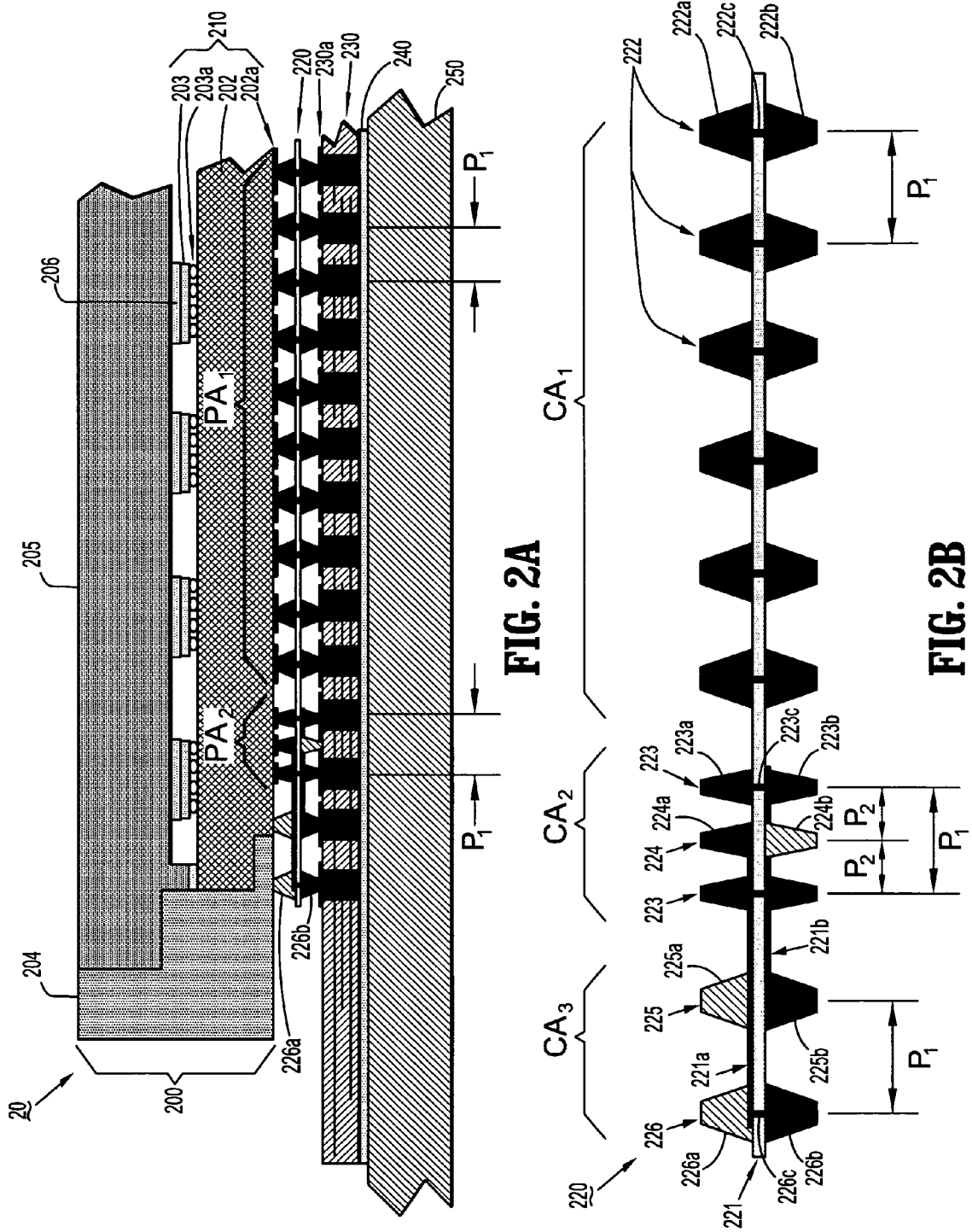

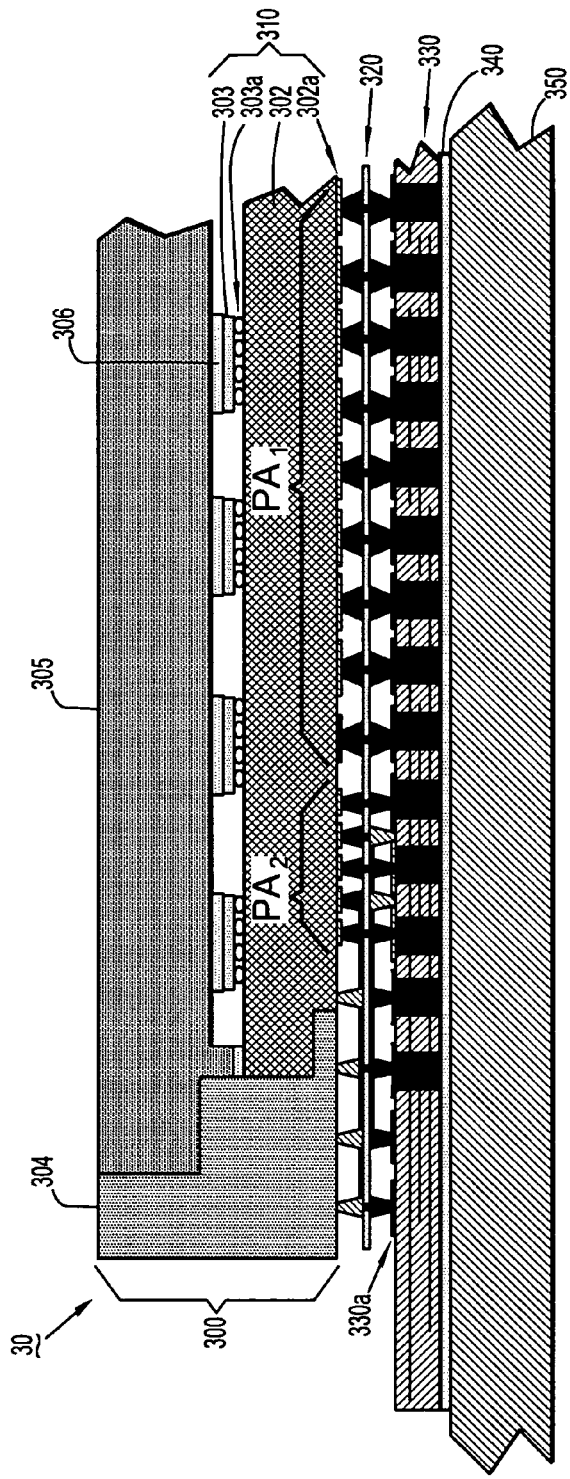
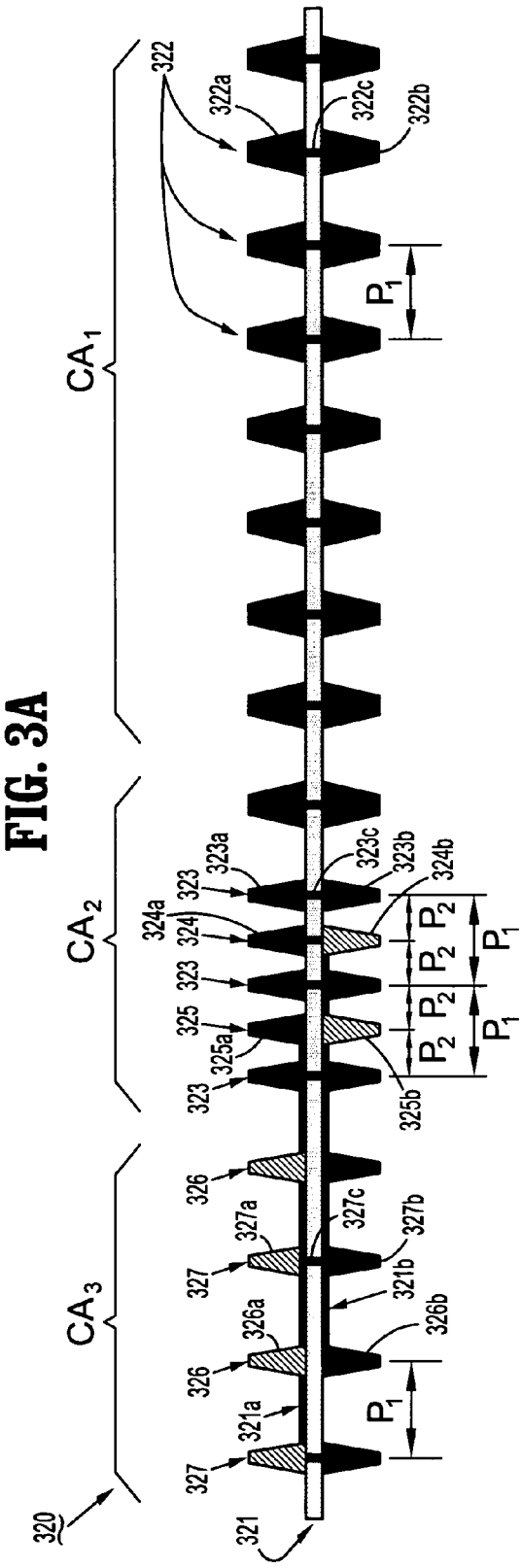
FIG. 3A
FIG. 3B

SPACE TRANSFORMING LAND GRID ARRAY INTERPOSERS

TECHNICAL FIELD OF THE INVENTION

The present invention generally relates to LGA (land grid array) interposers having variable pitch connectors and distribution wiring to support space transforming I/O (input/output) interconnections between first level chip modules and second level packaging. More specifically, the present invention relates to apparatus and methods for constructing high-performance electronic modules (such as processor modules for computer systems) using LGA interposers that provide space transform I/O interconnections between fine pitch I/O contacts on a chip module and coarse pitch contacts on a circuit board.

BACKGROUND

Innovations in semiconductor fabrication and packaging technologies have enabled development of smaller scale, higher density integrated circuit chips, as well as the development of highly integrated chip modules with wiring and area array I/O contact densities that enable dense packaging of IC (integrated circuit) chips. In certain applications, high-performance electronic modules can be constructed with one or more MCMs (multi-chip modules) mounted to a circuit board such as a system board (or node card), a PCB (printed circuit board), a PWB (printed wiring board), etc, using a suitable area array connection technique for module-to-board I/O and power interconnections.

By way of example, high performance computer systems are typically designed with high-performance processor modules having first level packages (chip modules) constructed using MCM technology to achieve high-density packaging of large numbers of IC processor chips, as well as LGA technology to achieve high-density and high-count I/O interconnections to a second level package (e.g., node card).

Current MCM technology using glass-ceramic substrates can readily accommodate the higher I/O and power density requirements for compact, high performance package designs. In general, state of the art MCM techniques allow a plurality of IC chips to be flip-chip bonded to a ceramic module substrate using small pitch, highly dense arrays of micro-solder ball interconnects formed between bonding pads on the active surfaces of the IC chips and matching arrays of contact pads formed on a chip mounting surface on the ceramic substrate. For example, with glass-ceramic technology, high-density arrays of contact pads with on center contact pitches in the range of 0.15 to 0.25 mm, for example, can be formed on the top side substrate surface. Moreover, glass-ceramic MCM technology supports the wiring densities that are required for escape routing from the top side high-density contact arrays to, e.g., other chips on the substrate and to high density arrays of I/O contacts formed on the bottom side of the MCM substrate for module I/O and power.

For high-performance package designs, LGA techniques enable direct interconnection between corresponding area arrays of I/O contacts formed on mating surfaces of a chip module (e.g., Single Chip Module, SCM, or MCM) and circuit board using a conductive interposer that is compressed between the module and board. Various types of LGA interposer structures have been developed which generally include, for example, rigid, semi-rigid and flexible substrate structures having arrays of electrical contacts formed by, e.g., compressible conductive spring structures, conductive metal-elastomer composites, wadded wire, etc. State of the art LGA techniques enable MCM-to-board interconnections with I/O interconnect densities/counts and electrical/mechanical properties that are desirable for high-performance CPU module designs. Moreover, LGA interposers provide electrical and mechanical interconnect techniques that allow MCM chip modules to be readily removable from circuit boards, which is advantageous for high-end modules such as CPU (Central Processor Unit) packages which may require repeated rework during production or are designed to be field-upgradeable. FIGS. 1A~1D schematically illustrate an electronic apparatus having a conventional LGA packaging structure for module-to-board I/O interconnection. FIG. 1A is a schematic cross-sectional side-view of an electronic apparatus (10) which generally comprises a chip module assembly (100), an LGA interposer (120), an electrical circuit board (130) and insulator layer (140) and a stiffener plate (150). The chip module assembly (100) comprises an MCM (multi-chip module) (110), a metallic support frame structure (104) and a thermal hat (105). The MCM (110) includes a module substrate (102) with a plurality of IC chips (103) flip-chip mounted to an array of contacts formed on the top surface of the substrate (102) via micro-solder balls (103a). The substrate (102) includes multiple levels of wiring and interconnects that provide electrical connections between top side contacts, other top side contacts, or an area array of I/O contacts (102a) formed on the bottom side of the substrate (102).

FIG. 1C is a schematic plan view of the bottom surface of the chip module assembly (100), which illustrates the bottom surfaces of the support frame (104) and the MCM substrate (102). The support frame (104) is designed to surround the perimeter of the MCM substrate (102). The support frame (104) includes various mechanical components (107) and (108) to support LGA alignment and actuation, as explained below. FIG. 1C illustrates a layout pattern of the I/O contacts (102a) on the bottom side of the substrate (102). In the exemplary embodiment, the area array of I/O contacts (102a) are arranged in 4 rectangular arrays (A1, A2, A3, A4) of evenly spaced metallized I/O pads, where the arrays are separately located in one of 4 quadrants on the bottom surface of the MCM substrate (102). FIG. 1D is an expanded view of a portion of the bottom surface of the chip module assembly (100) which includes the I/O contact array A1.

Referring again to FIG. 1A, the circuit board (130) includes an area array of contact pads (130a) on a top surface of the board (130) having a layout pattern matched to that of the area array of I/O contacts (102a) on the bottom of the MCM substrate (102). The board (130) includes conductive through vias (130b) formed within the board (130) below the contacts (130a). The board (130) includes multiple levels of wiring with connections to the conductive vias (130b) to thereby route I/O signals and power to the contacts (130a). The insulator sheet (140) electrically isolates the board (130) from the stiffener plate (150).

The LGA interposer (120) functions as a direct electrical interface to connect the I/O contacts (102a) on the bottom of the MCM substrate (102) to matching I/O contacts (130a) on the upper surface of the circuit board (130). FIG. 1B is a schematic side view illustration of the LGA interposer (120) of FIG. 1A. Referring to FIG. 1B, the LGA interposer (120) includes an insulating substrate (121) having an array (CA1) of columnar contact structures (122) aligned with corresponding I/O contacts (102a) on the bottom of the MCM substrate (102) and contacts (130a) on the top surface of the board (130). The LGA interposer (120) has a conventional framework based on conductive elastomer contact technology wherein the columnar contact structures (122) are formed of a composite of conductive metal particles embedded in a matrix of elastomer. Each columnar contact structure (122) includes an upper contact (122a) and a lower contact (122b), which are disposed on opposing surfaces of the substrate (121) and which are electrically connected through an aperture (122c) formed in the substrate (121). The contacts (122a) and (122b) are formed having larger heads on each side of the carrier (121) than the aperture (122c) such that each columnar contact (122) resembles a miniature rivet. The elastomer component of the contacts (122) provide the compliance that is needed to support the compressive force applied across each contact during LGA actuation, while accommodating possible nonplanar aspects of the mating surfaces. The electrical conductivity is provided by conductive fillers in the elastomer.

In general, the multichip module (110), LGA interposer (120), and circuit board (130) form a stacked structure, which is fixedly held together using a compression force applied by a hardware actuation structure to compress the LGA interposer (120) between the chip module (110) and board (130) with a force that is sufficient to ensure proper actuation of the LGA connectors (122). The support frame (104), package thermal hat (105) and stiffener plate (150) are mechanical components that serve various purposes including, e.g., mechanical support, thermal cooling, uniform loading of compression forces for LGA actuation, etc. For instance, the thermal hat (105) serves as a protective package lid as well as a heat spreader for cooling the IC chips (103). A thermal paste layer (106) is disposed between the back surface of the chips (103) and the thermal hat (105). The thermal paste (106) provides mechanical compliance and serves as a primary thermal path to transfer heat from the IC chips (103) to the thermal hat (105). An air cooled heat sink or a liquid cooled cold plate can be coupled to the thermal hat (105) to remove heat using known methods.

The metal support frame (104) serves to mechanically support the MCM (110), the thermal hat (105) and associated heat sink device mounted on top of the thermal hat (105). As shown in FIGS. 1A and 1B, the support frame (104) is designed to surround the outer perimeter of the MCM substrate (102). A silicone based adhesive is commonly used to bond a projection portion of the thermal hat (105) to the top surface of the MCM substrate (102) to form a semi-hermetic region around the ICs. Typically, the support frame (104) and the thermal hat (105) are bolted together.

The supporting frame (104) includes mechanisms to enable package assembly and LGA actuation. For instance, as shown in FIG. 1C, the support frame (104) includes alignment pins (107) which protrude from the bottom surface of the support frame (104) at two opposite corners thereof. These alignment pins (107) are aligned to, and mate with, alignment holes that are formed in the LGA interposer (120) and circuit board (130), to ensure proper alignment of I/O connections between the chip module (110) and board (130) through the LGA interposer (120). Moreover, hardware (108) is provided at the center of each side, for example, of the chip module assembly (100) as part of the LGA actuation structure.

Typically, LGA actuation is achieved using stiff springs which act to pull the MCM assembly (100) towards the stiffener plate (150) with a force that is sufficient to compress the LGA (120) between the MCM (110) and board (130). The supporting frame (104) and thermal hat (105) essentially form a top loading plate which acts to uniformly distribute the load around the top perimeter of the MCM substrate (102) which further distributes the load and the stiffener plate (150) is a bottom loading plate which acts to uniformly distribute the load across the system board (130), to thereby ensure uniform compression force across the LGA contact area. Only a minimal, if any, load is transferred through the thermal hat to the thermal paste layer and to the ICs (103) mounted on the MCM substrate (102).

FIGS. 1A~1D illustrate a conventional package structure in which MCM and LGA technologies can be utilized to construct compact, high performance electronic modules, such as CPU modules, having highly-density chip modules with high density I/O module-to-board interconnections. For area array package structures such as depicted in FIG. 1A, the package footprint (i.e. MCM substrate (102) size) is based, primarily in part, on the number of I/O connections (I/O count) that are needed for a given design as well as the I/O contact density (I/O pitch). As chip modules are constructed with higher chip densities and functionality requiring higher I/O counts, the modules must be designed with smaller I/O pitch to either maintain or reduce the chip module footprint. In other words, smaller I/O pitch for the module-to-board interconnections allows higher-I/O-count chip modules to be formed using the same, or smaller, substrate sizes, thus lowering package costs.

Although current MCM and LGA interposer technologies can achieve high I/O densities (I/O pitch less than 1 mm), the I/O interconnect density in conventional package structures such as depicted in FIG. 1A has currently reached a practical pitch limit of 1 mm (e.g., P1 in FIGS. 1A and 1B). This limit is governed primarily by economics and manufacturing requirements of complex multilayer circuit board fabrication, which mandate the use of low-cost and high production/high yield board fabrication methods. However, state of the art board fabrication technologies (e.g., sequential lamination method) that meet such requirements are not able to provide the plated thru hole size and wiring densities needed to support I/O contact arrays having I/O pitch less than 1 mm. Although fine-pitch organic package technologies (e.g., "build-up" layers which are used in first level packages to which chips are directly attached) may be used in lieu of conventional PCB to construct system boards or node cards, it is too expensive to fabricate an entire system board or node card, for example, using such organic package technologies.

Consequently, in the package design of FIG. 1A, the I/O density is limited by the 1 mm contact pitch of the area array (130a) of the board (130). In this regard, the ability to use smaller scale MCM structures is effectively limited by the amount of electrical contacts needed to meet I/O and power requirements (bottom surface area) for the given application rather than the number and size of the chips (top surface area). As the number of I/O increases, if the I/O density cannot be increased, the MCM package size must be increased to accommodate more I/O contacts. Since MCM structures are very expensive to fabricate, it is desirable to increase the I/O available on the bottom surface of an MCM without increasing the MCM area and without decreasing the pitch of contacts on a PCB or node card or an LGA connector beyond practical limits.

SUMMARY OF THE INVENTION

In an exemplary embodiment of the invention, an electronic apparatus includes a first level package structure, a second level package structure and an LGA (land grid array) interposer disposed between the first and second level package structures. The first level package structure includes a package substrate, one or more IC (integrated circuit) chips mounted on a first surface of the package substrate, and a first pattern of I/O contacts with pitch P1 formed on a second surface of the package substrate opposite the first surface. The second level package structure includes a second pattern of I/O contacts with pitch P2, wherein P2 is not equal to P1. The LGA connector provides space transform electrical interconnections between the first pattern and second pattern of I/O contacts, and further includes a dummy contact formed on at least a first or second surface of the LGA interposer and aligned to an LGA contact on an opposing surface of the LGA interposer.

In another exemplary embodiment of the invention, an electronic apparatus includes a package substrate, one or more IC chips mounted on a first surface of the package substrate, an electrical circuit board, a wiring network structure disposed on the electrical board, and an LGA (land grid array) interposer disposed between the package substrate and electrical circuit board. The package substrate has a first pattern of I/O contacts with pitch P1 and a second pattern of I/O contacts with pitch P2 formed on a second surface of the package substrate opposite the first surface. The electrical circuit board includes a third pattern of I/O contacts with pitch P2, wherein P2>P1. The wiring network structure disposed on the electrical board has a fourth pattern of I/O contacts with pitch P1. The LGA interposer includes a first array of LGA contacts with pitch P2 providing direct electrical connections between the second and third patterns of I/O contacts and an array of second LGA contacts with pitch P1 providing direct electrical connections between the first and fourth patterns of I/O contacts.

These and other exemplary embodiments, aspects, features and advantages of the present invention will become apparent from the following detailed description of exemplary embodiments, which is to be read in connection with the accompanying drawings.

BRIEF DESCRIPTION OF THE DRAWINGS

FIGS. 2A~2C schematically depict an electronic package structure constructed with a space transforming LGA interposer device according to an exemplary embodiment of the invention.

FIGS. 3A~3B schematically depict an electronic package structure constructed with a space transforming LGA interposer device according to another exemplary embodiment of the invention.

DETAILED DESCRIPTION OF EXEMPLARY EMBODIMENTS

Figure 2C:
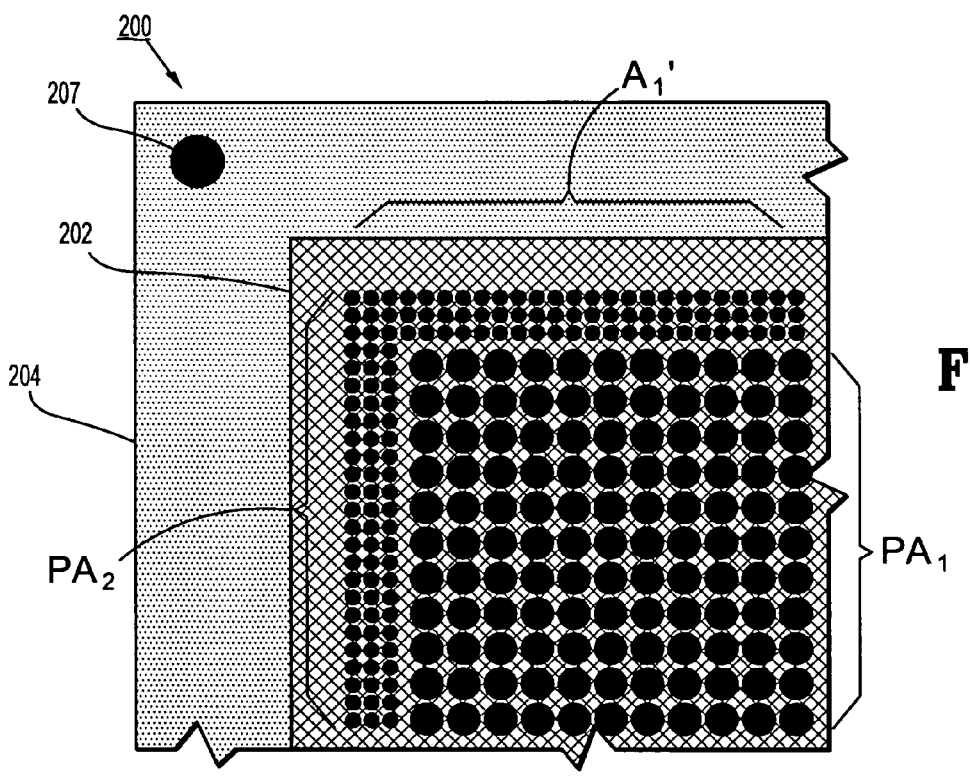

FIGS. 2A~2C schematically depict an electronic package structure that is constructed using a space transforming LGA connector according to an exemplary embodiment of the invention. In particular, FIG. 2A is a schematic cross-sectional side-view of an electronic apparatus (20) which generally comprises a chip module assembly (200), an LGA interposer (220), an electrical circuit board (230) an insulator layer (240) and a stiffener plate (250). The chip module assembly (200) comprises an MCM (multi-chip module) (210) (or, alternatively, an SCM (single-chip module)), a metallic support frame structure (204) and a thermal hat (205). The MCM (210) includes a carrier substrate (202) with a plurality of IC chips (203) (or single IC chip for an SCM) flip-chip mounted to an array of contacts formed on the top surface of the substrate (202) via micro-solder balls (203a). A thermal paste layer (206) is disposed between the back surface of the chips (203) and the thermal hat (205). The substrate (202) includes multiple levels of wiring and interconnects that provide electrical connections between top side contacts and other top side contact or an area array of I/O contacts (202a) formed on the bottom side of the substrate (202) (wherein the array of I/O contacts (202a) include arrays of coarse pitch pads PA1 and fine pitch pads PA2).

Figure 1A:
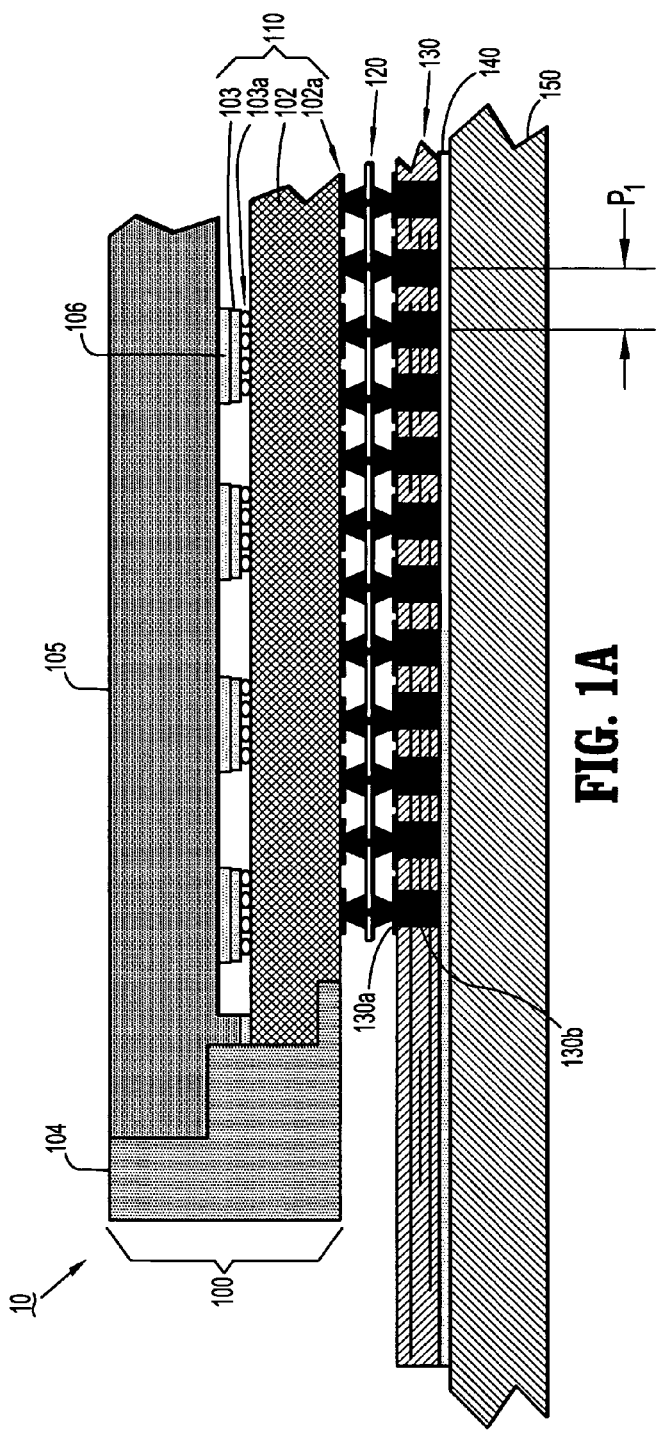
FIGS. 1A~1D schematically illustrate an electronic apparatus having a conventional packaging structure using LGA for module-to-board I/O interconnection.
Figure 1B:
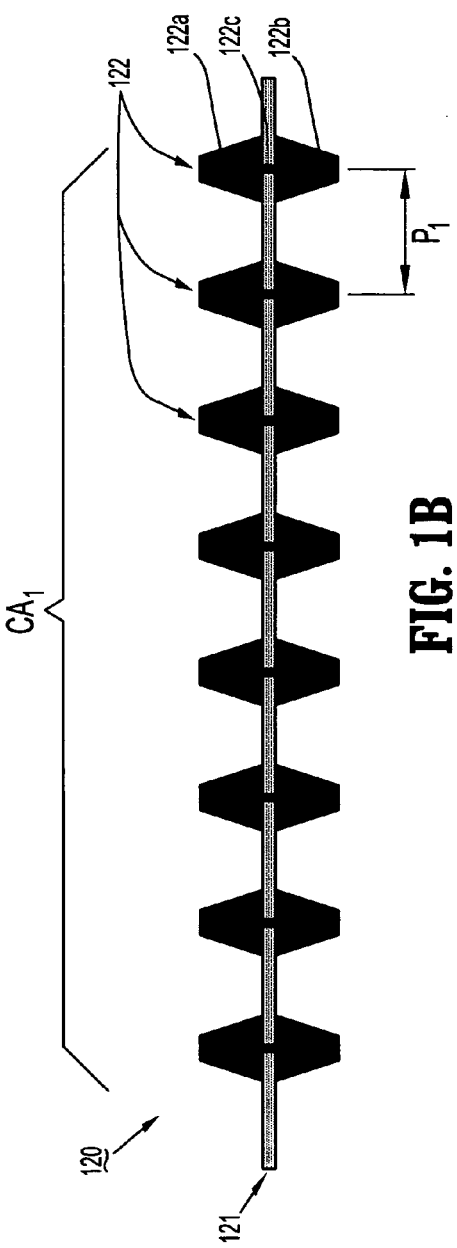
Figure 1C:
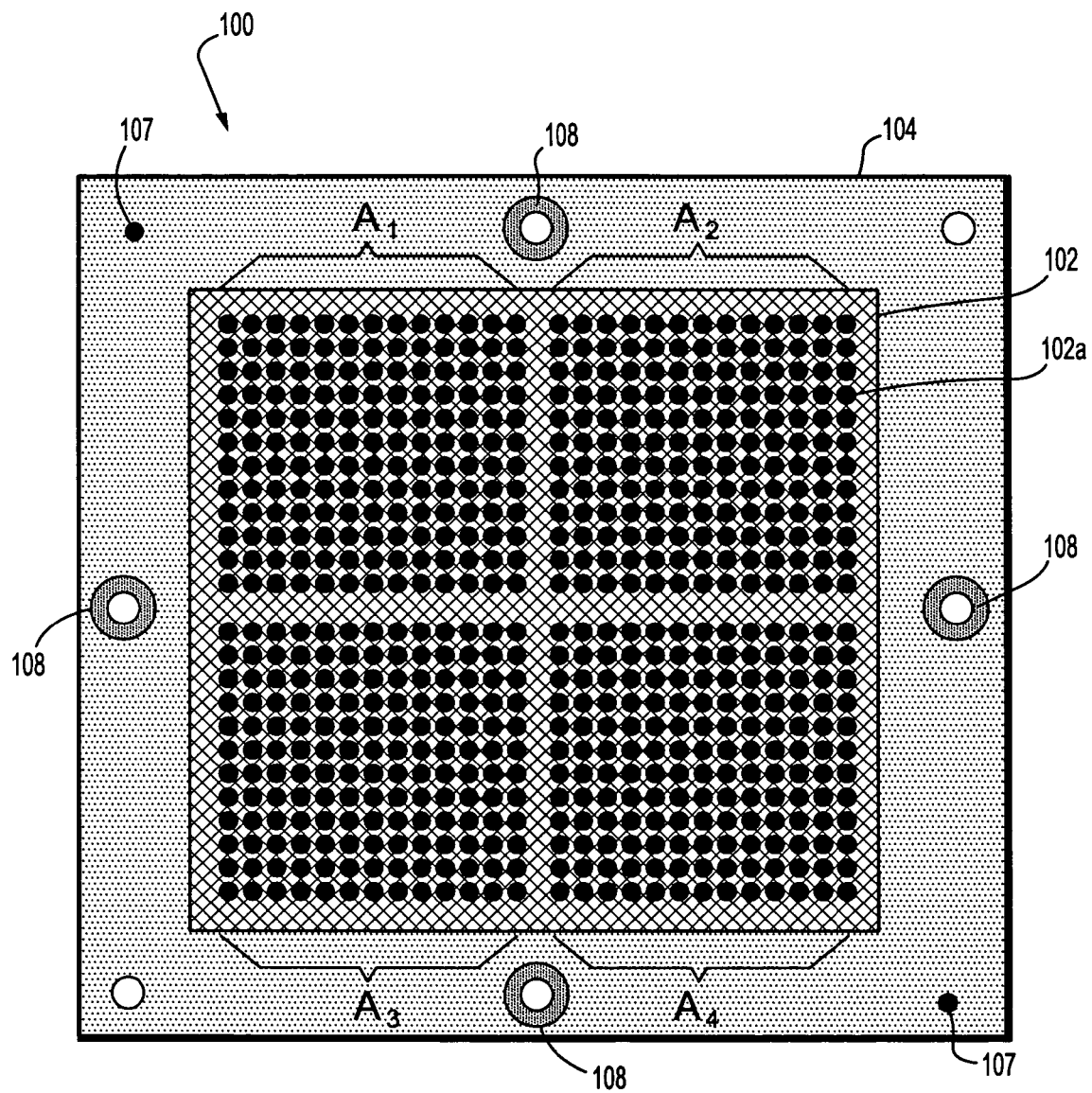

In general, the exemplary electronic package (20) has a stacked framework of components similar to that as described with reference to FIG. 1A and, therefore, a detailed explanation is not required. However, FIGS. 2A~2C illustrate an exemplary framework in which the LGA interposer (220) is designed to provide a space transform between the array of fine pitch contact pads PA2 on the bottom of the MCM substrate (202) to coarse pitch contact pads (230a) on the board (230). More specifically, FIGS. 2A~2C illustrate one exemplary embodiment in which the LGA interposer (220) is designed with variable pitch connectors and fan-out wiring to provide space transforming I/O interconnections between the array of fine pitch contact pads (PA2) (e.g., less than 1.0 mm pitch) formed in a peripheral region on the bottom surface of the MCM substrate (202), and coarse pitch board contact pads (230a) (e.g., 1.0 mm pitch) on the circuit board (230) in an expanded LGA area located in an outer periphery of the MCM substrate (202) and possibly the region under the support frame (204).

Figure 1D:
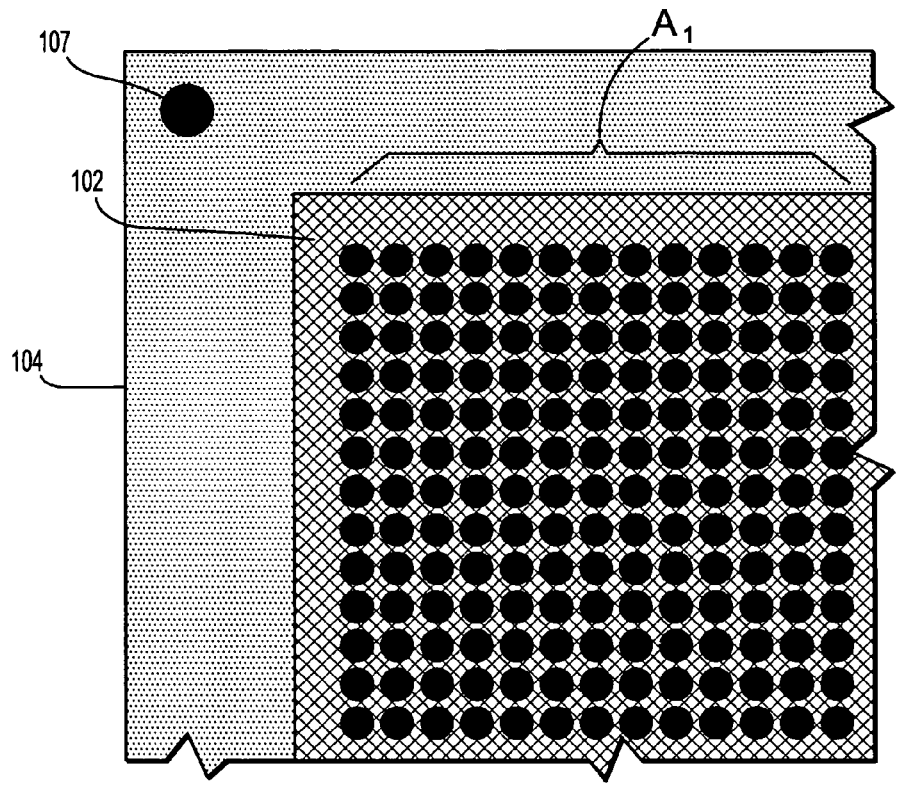

FIG. 2C is a schematic bottom view of one quadrant of the MCM assembly (200) of FIG. 2A including an array A1' of contact pads including a pad array $PA_1$ of coarse pitch I/O contact pads of pitch=P1, and pad array $PA_2$ of fine pitch I/O contact pads of pitch=P2, where P1>P2. In particular, the exemplary pad array A1' depicted in FIG. 2C can be viewed as a modification of the pad array A1 depicted in FIG. 1D, wherein the outer 2 rows of P1=1.0 mm pitch contact pads in the array A1 (as depicted in FIG. 1D) are replaced with the pad array $PA_2$ comprising three rows of, for example, P2=0.5 mm pitch contact pads. As noted above, state of the art ceramic MCM technologies support high density pad arrays with contact pitches in the range of 0.15 to 0.25 mm pitch pads.

As illustrated in FIG. 2A, the array of I/O contacts (230a) on the circuit board (230) is formed with contact pitch P1. The exemplary LGA interposer (220) provides direct electrical connections between I/O contact pads in pad array $PA_1$ on the bottom of the MCM substrate (202) and matching I/O contacts on the board (230), as well as space transform (i.e., fan out) electrical connections between I/O contact pads in pad array $PA_2$ and matching board contacts or remote board contacts on the board (230) in an expanded LGA area near and past the peripheral edge of the MCM substrate (202).

FIG. 2B is a detailed illustration of the exemplary LGA interposer (220), which comprises a flexible insulating polymer substrate (221) (e.g. polyimide) having an array of varying pitch LGA contact structures formed thereon. For instance, a first array of LGA contacts (CA1) include contacts (222) that are separated by an on-center pitch of P1. Each LGA contact (222) is a "straight-through" contact structure formed by an upper conductive polymer contact (222a) and a lower conductive polymer contact (222b) that are aligned to each other on opposite surfaces of the substrate (221) and electrically connected through an opening (222c) formed in the substrate (221). As depicted in FIG. 2A, the array of LGA contacts (222) provide direct electrical connections between MCM I/O contacts in the pad array $PA_1$ and corresponding board contacts (230a).

The LGA interposer (220) further comprises a second array of LGA contacts (CA2) having a contact pitch P2, where P2<P1. The second array of LGA contacts (CA2) include "straight-through" contacts (223) formed by upper conductive polymer contacts (223a) and lower conductive polymer contacts (223b), which are electrically connected through openings (223c) formed in the substrate (221). In addition, the array of LGA contacts (CA2) include "non-straight-through" contact (224) structures that are formed by an upper conductive polymer contact (224a) and a lower non-conductive polymer contact (224b) (which is implemented for purposes of load transfer, as explained below). In the exemplary embodiment of FIGS. 2A and 2B, the upper conductive polymer contacts (223a, 224a) in the LGA contact array (CA2) are formed with contact pitch P2 and matched to the I/O contacts of pad array ($PA_2$) on the bottom surface of the MCM substrate (202). Assuming that P2 is ½ of P1 (e.g., P2 is 0.5 mm and P1 is 1 mm), the array of LGA contacts (CA2) can be formed with straight-through contacts (223) with contact pitch P1 so as to provide direct electrical connections between some I/O contacts in the pad array $PA_2$ of MCM substrate (202) and corresponding board contacts (230a).

Moreover, the exemplary LGA interposer (220) comprises a "fan-out" framework that provides a space transform between the finer pitch (e.g., 0.5 mm pitch) MCM I/O contacts of pad array $PA_2$ to the coarser pitch (e.g., 1.0 mm pitch) contact pads (230a) on the surface of the board (230). The "fan out" framework includes upper metallization wiring (221a) and lower metallization wiring (221b) formed on the top and bottom surfaces of the polymer substrate (221) which function to fan-out (re-route) some I/O from the array CA2 of fine pitch array LGA contacts to an array CA3 of coarser pitch LGA contacts located in a peripheral region of the MCM substrate (202) beyond the I/O contact array (202a) on the MCM substrate (202). In the exemplary embodiment, the array of LGA contacts (CA3) include non-straight-through contacts (225) and (226) with pitch P1. The contact (225) is formed by an upper non-conductive polymer contact (225a) and a lower conductive polymer contact (225b). The contact (226) is formed by an upper non-conductive polymer contact (226a) and a lower conductive polymer contact (226b). The lower conductive polymer contact (226b) is connected to the upper metallization wiring (221a) through an opening (226c) in the flexible substrate (221) under the non-conductive polymer contact (226a). The lower conductive polymer contact (225b) is molded to contact the lower metallization wiring (221b) which provides an electrical connection between the conductive polymer contact (225b) and one or more upper and/or lower conductive polymer contacts in the fine pitch array CA2 of LGA contacts. Moreover, the lower conductive polymer contact (226b) contacts the upper metallization wiring (221a) through the opening (226c), which provides an electrical connection between the conductive polymer contact (226b) and one or more upper and/or lower conductive polymer contacts in the LGA contact array CA2. This fan out framework is designed such that, as depicted in FIGS. 2A and 2B, the conductive polymer contacts (222b, 223b, 225b, 226b) formed on the bottom surface of the LGA substrate (221) have a contact pitch P1 matched to the area array of contacts (230a) on the board (230).

In the exemplary embodiment of FIG. 2A, the portion of the support frame (204) under the MCM substrate (202) is coplanar with the bottom surface of the MCM substrate (202), where the upper non-conductive polymer contacts (225a) and (226a) make contact to the bottom surface of the MCM substrate (202) and frame structure (204), respectively. In this exemplary embodiment, the region of support frame (204) in contact with the LGA (220) is flat and co-planar with the MCM substrate (202) so that the LGA (220) can be actuated simultaneously under both the MCM substrate (202) and support frame (204). The upper non-conductive polymer contacts (225a) and (226a) and the lower non-conductive polymer contact (224b) are provided to transfer the load and insure that the corresponding conductive polymer contacts (225b) and (226b) and (224a) to which they are aligned, respectively, are adequately compressed during LGA actuation. The term "dummy contact" as used herein generally refers to a contact that is used for purposes of load transfer, but not providing electrical connections. A "dummy contact" may be a non-conductive contact (e.g., non-conductive polymer contacts) or a conductive contact (e.g., conductive polymer contact) that is electrically isolated.

The conductive and insulating polymer contacts of the LGA interposer (220) can be designed so that the required loading and final compressed height of the LGA contacts over the different pitch LGA contact arrays are substantially the same. For example, for LGA contact arrays of 1.0 and 0.5 mm pitch, the loading requirement for the 0.5 mm pitch LGA contacts would be one fourth the loading requirements of the 1.0 mm pitch LGA contacts. Further, for a given pitch, it is desirable for the insulating polymer contacts to have similar loading and compression behavior as the conductive polymer contacts. The loading requirements can be adjusted at the mold design stage by changing the diameter, the conic angle, and other shape features of the different contact structures (222, 223, 224, 225, 226) over the different pitch arrays of LGA contacts (e.g., CA1, CA2 and CA3). In other exemplary embodiments, hard stop structures may be employed to prevent additional actuation forces from being generated in regions of the LGA interposer (220) that are designed for lower actuation forces.

It is to be appreciated that for a given-fixed chip module footprint, the exemplary embodiment of FIGS. 2A~2C allows a significant increase in module-to-board I/O interconnections using the space transforming LGA interposer (220), as compared to the conventional design of FIGS. 1A~1D. More specifically, by way of example, assume that the MCM chip modules (110) and (210) have similar size substrates (102) and (202). Assume further that the MCM substrate (102) where the I/O contacts on the MCM substrate (102a) has 7396 I/O contacts arranged as four arrays of 43×43 contact pads on 1 mm centers with about a 2 mm gap between the arrays A1~A4. Replacing the outer row of 1 mm contacts, (4×(42+43))=340 with 2 rows of 0.5 mm contacts, yields an additional 1020 contacts (or a total of 8416) providing a 1.14× increase in the I/O count without increasing the MCM footprint.

FIGS. 3A~3B schematically depict an electronic package structure that is constructed using a space transforming LGA connector according to an exemplary embodiment of the invention. In particular, FIG. 3A is a schematic cross-sectional side-view of an electronic apparatus (30) which generally comprises a chip module assembly (300), an LGA interposer (320), an electrical circuit board (330) an insulator layer (340) and a stiffener plate (350). The chip module assembly (300) comprises a MCM (multi-chip module) (310) (or, alternatively, an SCM (single-chip module)), a metallic support frame structure (304) and a thermal hat (305). The MCM (310) includes a carrier substrate (302) with a plurality of IC chips (303) (or single IC chip for an SCM) flip-chip mounted to an array of contacts formed on the top surface of the substrate (302) via micro-solder balls (303a). A thermal paste layer (306) is disposed between the back surface of the chips (303) and the thermal hat (305). The substrate (302) includes multiple levels of wiring and interconnects that provide electrical connections between top side contacts and other top side contact or an area array of I/O contacts (302a) formed on the bottom side of the substrate (302) (wherein the array of I/O contacts (302a) include arrays of coarse pitch pads $PA_1$ and fine pitch pads $PA_2$).

In general, the exemplary electronic package (30) has a stacked framework of components similar to that as described with reference to FIGS. 1A and 2A and, therefore, a detailed explanation is not required. FIGS. 3A~3B illustrate an exemplary framework in which the LGA interposer (320) is designed with variable pitch connectors and fan-out wiring to provide space transforming I/O interconnections between the array of fine pitch contact pads ($PA_2$) (e.g., less than 1.0 mm pitch) formed in a peripheral region on the bottom surface of the MCM substrate (302), and coarse pitch board contact pads (330a) (e.g., 1.0 mm pitch) on the circuit board (330) in an expanded LGA area located in an outer periphery of the MCM substrate (302) and the region under the support frame (304). The exemplary pad array (302a) can be viewed as a modification of the pad array (102a), wherein the outer 2 rows of P1=1.0 mm pitch contact pads in each array A1~A4 (as depicted in FIG. 1D) are replaced with the pad array $PA_2$ comprising five rows of contacts that are separated by a pitch P2 (e.g., P2=0.5 mm).

FIG. 3B is a detailed illustration of the exemplary LGA interposer (320), which comprises a flexible insulating polymer substrate (321) (e.g. polyimide) having an array of varying pitch LGA contact structures formed thereon. For instance, a first array of LGA contacts (CA1) include contacts (322) that are separated by an on-center pitch of P1. Each LGA contact (322) is a "straight-through" contact structure formed by an upper conductive polymer contact (322a) and a lower conductive polymer contact (322b) that are aligned to each other on opposite surfaces of the substrate (321) and electrically connected through an opening (322c) formed in the substrate (321). As depicted in FIG. 3A, the array of LGA contacts (322) provide direct electrical connections between MCM I/O contacts in the pad array $PA_1$ and corresponding board contacts (330a).

The LGA interposer (320) further comprises a second array of LGA contacts (CA2) having a contact pitch P2, where P2<P1. The second array of LGA contacts (CA2) include "straight-through" contacts (323) formed by upper conductive polymer contacts (323a) and lower conductive polymer contacts (323b), which are electrically connected through openings (323c) formed in the substrate (321). In addition, the array of LGA contacts (CA2) include "non-straight-through" contacts (324) and (325) that are formed by an upper conductive polymer contacts (324a) and (325a) and a lower non-conductive polymer contact (324b) and (325b) which are implemented for purposes of load transfer. The upper conductive polymer contacts (323a, 324a, 325a) in the LGA contact array (CA2) are formed with contact pitch P2 and matched to the I/O contacts of pad array (PA2) on the bottom surface of the MCM substrate (302). Assuming that P2 is ½ of P1 (e.g., P2 is 0.5 mm and P1 is 1 mm), the array of LGA contacts (CA2) can be formed with straight-through contacts (323) with contact pitch P1 so as to provide direct electrical connections between some I/O contacts in the pad array $PA_2$ of MCM substrate (302) and corresponding board contacts (330a).

The exemplary LGA interposer (320) comprises a "fanout" framework that provides a space transform between the finer pitch (e.g., 0.5 mm pitch) MCM I/O contacts of pad array $PA_2$ to the coarser pitch (e.g., 1.0 mm pitch) contact pads (330a) on the surface of the board (330). The "fan out" framework includes upper metallization wiring (321a) and lower metallization wiring (321b) formed on the top and bottom surfaces of the polymer substrate (321) which function to fan-out (re-route) some of the I/O from the array CA2 of fine pitch array LGA contacts to an array CA3 of coarser pitch LGA contacts located in a peripheral region of the MCM substrate (302) beyond the I/O contact array (302a) on the MCM substrate (302). In the exemplary embodiment, the array of LGA contacts (CA3) include non-straight-through contacts (326) and (327) with pitch P1. The contacts (326) are formed by upper non-conductive polymer contacts (326a) and lower conductive polymer contacts (326b). The contacts (327) are formed by upper non-conductive polymer contacts (327a) and lower conductive polymer contacts (327b). The lower conductive polymer contacts (327b) are connected to the upper metallization wiring (321a) through openings (327c) in the flexible substrate (321) under the non-conductive polymer contacts (327a). The lower conductive polymer contacts (326b) are molded to contact the lower metallization wiring (321b) which provides an electrical connection between the conductive polymer contacts (326b) and one or more upper and/or lower conductive polymer contacts in the fine pitch array CA2 of LGA contacts. Moreover, the lower conductive polymer contacts (327b) contact the upper metallization wiring (321a) through the respective openings (327c) to provide an electrical connection between the conductive polymer contacts (327b) and one or more upper and/or lower conductive polymer contacts in the LGA contact array CA2. This fan out framework is designed such that, as depicted in FIGS. 3A and 3B, the conductive polymer contacts (322b, 323b, 326b, 327b) formed on the bottom surface of the LGA substrate (321) have a contact pitch P1 matched to the area array of contacts (330a) on the board (330).

In the exemplary embodiment of FIG. 3A, the portion of the support frame (304) under the MCM substrate (302) is coplanar with the bottom surface of the MCM substrate (302), where the upper non-conductive polymer contacts (326a) and (327a) make contact to the bottom surface of the MCM substrate (302) and frame structure (304). In this exemplary embodiment, the region of support frame (304) in contact with the LGA (320) is flat and co-planar with the MCM substrate (302) so that the LGA (320) can be actuated simultaneously under both the MCM substrate (302) and support frame (304). The upper non-conductive polymer contacts (326a) and (327a) and the lower non-conductive polymer contacts (324b) and (325b) are provided to transfer the load and insure that the corresponding conductive polymer contacts (326b) and (327b) and (324a) and (325b) to which they are aligned, respectively, are adequately compressed during LGA actuation. As noted above, the conductive and insulating polymer contacts of the LGA interposer (320) can be designed so that the required loading and final compressed height of the LGA contacts over the different pitch LGA contact arrays are substantially the same. The loading requirements can be adjusted at the mold design stage by changing the diameter, the conic angle, and other shape features of the different contact structures over the different pitch arrays of LGA contacts (e.g., CA1, CA2 and CA3). In other exemplary embodiments, hard stop structures may be employed to prevent additional actuation forces from being generated in regions of the LGA interposer (320) that are designed for lower actuation forces. It may be desirable to have an opening in the insulator substrate (321) even for "non straight-through" contacts to help secure the polymer contacts to the substrate (321). In such instance, such contacts can be formed while maintaining electrical isolation.

It is to be appreciated that for a given-fixed chip module footprint, the exemplary embodiment of FIGS. 3A~3B allows a significant increase in module-to-board I/O interconnections using the space transforming LGA interposer (320), as compared to the conventional design of FIGS. 1A~1D. More specifically, by way of example, assume that the MCM chip modules (110) and (310) have similar size substrates (102) and (302). Assume further that the MCM substrate (102) where the I/O contacts on the MCM substrate (102) has 7396 I/O contacts arranged as four arrays of 43×43 contact pads on 1 mm centers with about a 2 mm gap between the arrays A1~A4 The exemplary pad array (302a) can be viewed as a modification of the pad array (102a), wherein the outer 2 rows of P1=1.0 mm pitch contact pads in each array A1~A4 (as depicted in FIG. 1D) ((4×2×(41+43))=672 contacts) are replaced with 4 rows of 0.5 mm pitch contacts to form I/O contact pad array $PA_2$ in FIG. 3A (which shows 5 rows, instead of the 4 described here), which yields an additional 2016 contacts, for a total of 9412, providing a 1.27× increase in the number of I/O contacts.

Figure 4:
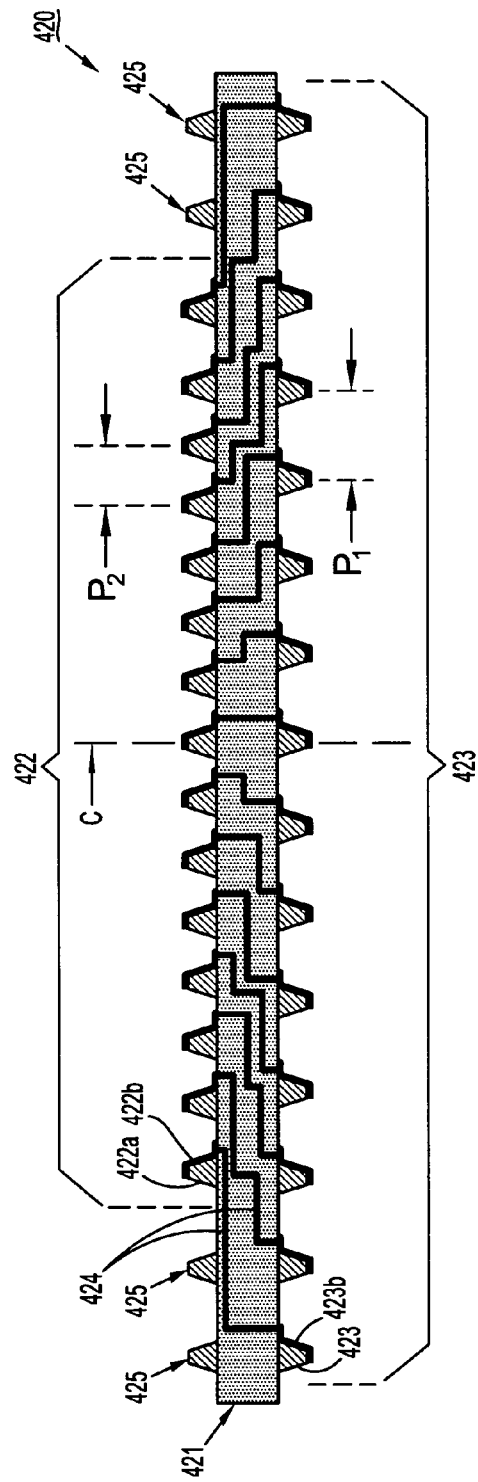
FIG. 4 is a schematic side-view of a space transforming LGA interposer device according to another exemplary embodiment of the invention.

FIG. 4 is a schematic side-view of a space transforming LGA interposer device according to another exemplary embodiment of the invention. In particular, FIG. 4 illustrates an LGA interposer (420) comprising a substrate (421) having an array of LGA contacts (422) formed with pitch P2 (e.g., about 0.66 mm) on the top surface of the substrate (421) and an array of LGA contacts (423) formed with pitch P1 (e.g., 1.0 mm) on the bottom surface of the substrate (421). The substrate (421) may be a fine pitch circuit board, or a multilevel flexible circuit structure, that is formed with internal redistribution wiring (424) providing space transforming (fan-out) electrical connections between the array of fine pitch LGA contacts (422) and an array of coarse pitch LGA contacts (423). Each LGA contact (422) is formed by a non-conductive polymer column (422a) coated with a conductive layer (422b). Similarly, each LGA contact (423) is formed by a non-conductive polymer column (423a) coated with a conductive layer (423b). The insulating polymer columns (422a, 423a) are designed to provide compliance that supports the compressive force applied to the LGA contacts (422) and (423) during LGA actuation, while the conductive layers (422b, 423b) are designed to directly interface with I/O contacts and provide direct electrical connections from the I/O contacts to the distribution wiring (424).

The LGA interposer device (420) is an exemplary framework that enables module-to-board I/O interconnection with space transform from an array of fine-pitch I/O contacts formed on the entire bottom side of a chip module and an array of coarse pitch I/O contacts formed on a circuit board (PCB or node card). For example, the array of LGA contacts (422) can be formed with a contact pitch P2=0.66 mm (or less), for example, which is matched to an array of bottom-side I/O contacts on a SCM or MCM substrate. Further, the array of LGA contacts (423) can be formed with contact pitch P1=1.0 mm, for example, which is matched to an array of I/O board contacts. State of the art techniques for fabricating fine pitch circuit boards or multilevel flexible circuits may be readily used to construct the substrate (421) having the internal distribution wiring (424) with the wiring density needed to fan out the electrical connections from the array of fine pitch LGA contacts (422) to the array of coarse pitch LGA contacts (423). Moreover, the substrate (421) can be designed with ground planes or other structures that provide power shielding, reduced electromagnetic interference, controlled impedance lines, and reduced cross talk, etc. The added wiring levels allow decoupling capacitors to be fabricated as part of the fan-out distribution wiring (424).

In the exemplary embodiment of FIG. 4, the arrays of LGA contacts (422) and (423) are aligned at central points C thereof. Since the footprint of the fine pitch LGA contact array (422) is smaller than the footprint of the coarse pitch LGA contact array (423), a plurality of dummy contacts (425) may be formed on the top surface of the substrate (421) around the outer perimeter of the LGA contact array (422). These dummy contacts (425) can be aligned to respective lower LGA contacts (423) on the bottom surface of the substrate (421) as a means to provide the loading needed to ensure actuation of the outer rows of contacts of the LGA contact array (423). The dummy contacts (425) may be formed of non-conductive material, or conductive material that is electrically isolated. In the exemplary embodiment of FIG. 4, with a sufficiently stiff substrate (421), dummy contacts are not needed in the central portion of the LGA substrate (421) where the arrays of LGA contacts (422) and (423) overlap.

FIG. 4 depicts one exemplary embodiment in which a space transforming LGA interposer structures can be formed, in general, by molding insulating polymer contacts (or bumps) to a substrate having internal redistribution wiring, and then applying a conductive coating over the insulating polymer contacts to provide electrical connections. In other exemplary embodiments, LGA interposers can be formed by molding insulating polymer contacts to a single-sided or double-sided flexible circuit structure and forming conductive coating on such contacts to provide electrical connections using techniques such as described in PCT Applications PCT/US2005/035326 and PCT/US2005/035322, entitled, "Metalized Elastomeric Electrical Contacts", which are based on U.S. Provisional Application No. 60/636,666, filed on Dec. 16, 2004, all of which are commonly assigned and fully incorporated herein by reference.

For example, these techniques could be applied to construct space transforming LGA interposers having frameworks similar to the LGA interposers (220) and (320) discussed above, wherein all upper and lower contacts are formed by insulating polymer columns that are molded to a flexible circuit and wherein conductive coatings are formed over the insulating polymer contacts to provide the necessary electrical connections. In such case, the upper and lower insulating contacts employed for purposes of load transfer would not be coated with conductive material, or if coated, would be electrically isolated. Alternately, the upper and lower contacts could be formed using a polymer filled with metal, or other conductive, particles as described previously.

Figure 5:
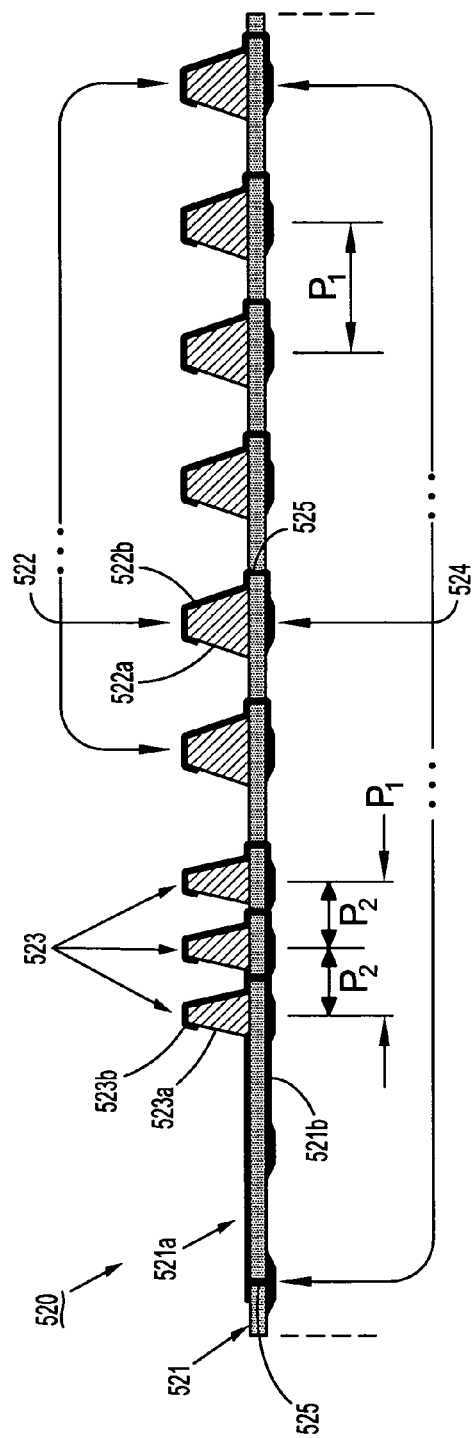
FIG. 5 is a schematic side-view of a space transforming LGA interposer device according to another exemplary embodiment of the invention.

FIG. 5 is a schematic side-view of a space transforming LGA interposer according to another exemplary embodiment of the invention. In particular, FIG. 5 illustrates an LGA interposer (520) comprising a substrate (521) having an array of LGA contacts (522) formed with pitch P1 (e.g., 1.0 mm) and array of LGA contacts (523) formed with pitch P2 (e.g., 0.5 mm) on the top surface of the substrate (521) and an array of solder pads (524) formed with pitch P1 (e.g., 1.0 mm) on the bottom surface of the substrate (521). The substrate (521) is a flexible circuit structure having upper and lower distribution wiring (521a) and (521b) on top and bottom surfaces thereof, and conducting through holes (525). Each LGA contact (522) is formed by a non-conductive polymer column (522a) coated with a conductive layer (522b). Similarly, each LGA contact (523) is formed by a non-conductive polymer column (523a) coated with a conductive layer (523b).

In the exemplary embodiment of FIG. 5, an array of coarse pitch (P1) "straight-through" LGA contact structures are formed by upper LGA contacts (522) aligned to respective solder pads (524) on opposite sides of the flex substrate (521), where electrical connections are provided from the conductive layers (522b) on the insulating polymer column (522a) to respective solder pads (524) via the conductive through holes (525) in the flex substrate (521). Moreover, the LGA interposer (520) comprise an array of fine pitch LGA contacts (523) that are separated with pitch P2, where P2<P1. The upper and lower wiring (521a, 521b) and conductive through holes (525) of the substrate (521) provide the fan-out network that allows space transform from some of the fine pitch LGA contacts (523) to coarse-pitch solder pads (524) that are formed on the bottom of the substrate (521) beyond the footprint of the upper array of LGA contacts (523). In addition, straight-through LGA contact structures may be formed by some of the upper LGA contacts (523) aligned to respective solder pads (524) on opposite sides of the flex substrate (521), where electrical connections are provided from the conductive layers (523b) on the insulating polymer column (523a) to respective solder pads (524) via the conductive through holes (525) in the flex substrate (521).

The LGA interposer device (520) is an exemplary framework that enables module-to-board I/O interconnection with space transform from an array of fine-pitch I/O contacts formed on the bottom side of a chip module and an array of coarse pitch I/O contacts formed on a circuit board (PCB or node card). For purposes of illustration, the exemplary LGA interposer (520) of FIG. 5 has a space transforming network similar to that of the exemplary LGA interposer (220) of FIG. 2B. In FIG. 5, the array of solder pads (524) are connected to a matching array of I/O contacts on an electrical board.

In the exemplary embodiment, solder balls may be employed instead of solder pads (524), although solder pads are preferred over solder balls for various reasons. For instance, solder balls may be formed with significant height variations, which can result in non-uniform LGA actuation of the upper contacts (522) and (523) to bottom side MCM contacts. Moreover, although solder ball connections can structurally withstand higher stresses, the use of a flexible circuit substrate (521) with low stiffness and a thermal expansion coefficient similar to that of the material forming the board, reduces the shearing and bending stresses caused by thermal cycling that may lead to contact failure of thin solder pad (524). Moreover, it would be difficult to use "dummy" solder balls to provide support under the LGA contacts (523) that are not "straight-through" connected to LGA contacts on the bottom surface of the substrate (521). By using thin solder pads (524), support is not needed, although "dummy" solder pads can be employed.

In other exemplary embodiments of the invention similar to that shown in FIG. 5, an LGA interposer can be formed with an insulated substrate having an array of solder pads formed on a bottom surface of the substrate and an array of metal pads formed on the top surface of the substrate, where the bottom solder pads and upper metal pads are electrically connected by conductive through vias, and in some cases, local wiring. Compliant column structures could then be formed on top of the metal pads by direct injection molding a metal particle filled elastomer material, such as siloxane and other polymer binder materials, that would be able to withstand solder reflow temperatures up to about 250° C. The metal particle filled elastomer could be used to form the conductive through vias and/or a metal coating could be used for this purpose.

Figure 6:
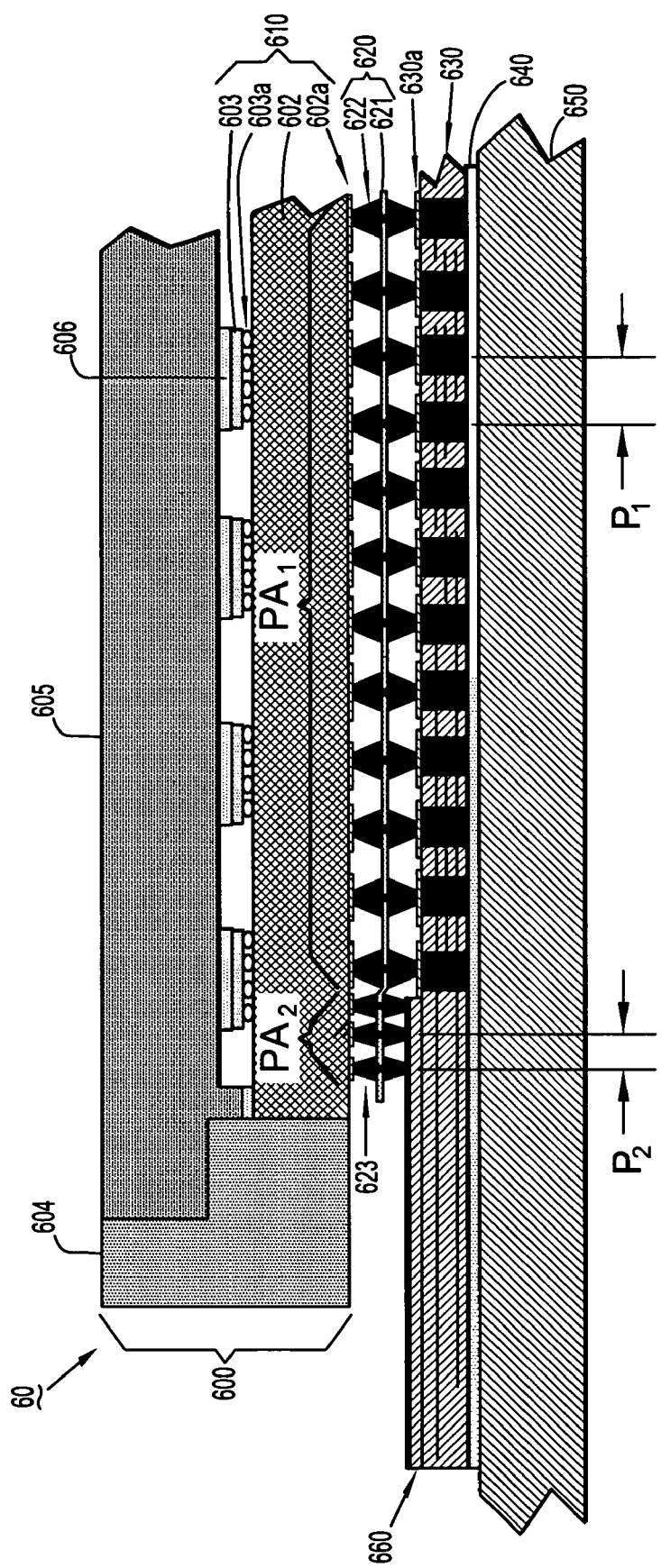
FIG. 6 schematically depicts an electronic package structure constructed with a variable pitch LGA interposer device and a local wiring network structure, according to an exemplary embodiment of the invention.

FIG. 6 schematically depicts an electronic package structure having a variable pitch LGA connector according to an exemplary embodiment of the invention. In particular, FIG. 6 is a schematic cross-sectional side-view of an electronic apparatus (60) which generally comprises a chip module assembly (600), an LGA interposer (620), an electrical circuit board (630) an insulator layer (640) and a stiffener plate (650). The chip module assembly (600) comprises an MCM (multi-chip module) (610) (or, alternatively, an SCM (single-chip module)), a metallic support frame structure (604) and a thermal hat (605). The MCM (610) includes a carrier substrate (602) with a plurality of IC chips (603) (or a single IC chip for an SCM) flip-chip mounted to an array of contacts formed on the top surface of the substrate (602) via micro-solder balls (603a). A thermal paste layer (606) is disposed between the back surface of the chips (603) and the thermal hat (605). The substrate (602) includes multiple levels of wiring and interconnects that provide electrical connections between top side contacts and other top side contacts or an area array of I/O contacts (602a) formed on the bottom side of the substrate (602) (wherein the array of I/O contacts (602a) include arrays of coarse pitch pads $PA_1$ and fine pitch pads $PA_2$).

In general, the exemplary electronic package (60) has a stacked framework of components similar to that as described with reference to FIG. 2A and, therefore, a detailed explanation is not required. However, module-to-board I/O interconnections is implemented by the LGA interposer (620) with variable pitch contacts and a local wiring network structure (660) formed on the board (630) which can also be used to form module-to-module or other interconnects. In particular, the LGA interposer (620) comprises a flexible insulative substrate (621) having an array of "straight-through" conductive polymer LGA contacts (622) with pitch P1 and an array of "straight-through" conductive polymer LGA contacts (623) with pitch P2, where P2<P1. The array of LGA contacts (622) provide direct electrical connections between matching arrays of MCM contacts in the pad array $PA_1$ and corresponding board contacts (630a) of pitch P1. The array of LGA contacts (623) provide direct electrical connection between the fine pitch array of I/O pads ($PA_2$) formed on the peripheral region of the bottom of the MCM substrate (602), and contacts formed on the local wiring network structure (660) formed on the board (630).

In one embodiment, the wiring network (660) may be a flexible circuit structure that is connected to the board (630) and formed with wiring to connect to the peripheral finer pitch LGA contacts (623). The flexible circuit structure can be accurately aligned to the board (630) by solder pads on the flexible circuit and matching metal lands on the board (630). The flexible circuit may be formed with a thin profile (e.g., about 0.05 to 0.1 mm) so as to minimize the non-planarity on the board side and allow adequate LGA actuation. To accommodate the added thickness of the flexible circuit, the fine pitch conductive polymer LGA contacts (623) could be formed to be slightly shorter than the larger pitch conductive polymer LGA contacts (622). In another embodiment of the invention, the wiring network structure (660) may be a local build-up layer on top of the board (630) that is formed with local dense wiring to enable short distance connections. The use of local build up layers eliminates alignment issues (with the flexible circuit) and allows wiring to be easily routed around components mounted on the board (630) near the chip module assembly (600). The wiring network structure (660) provides the additional fine pitch wiring and avoids having the degraded high frequency performance from via stubs in the board (630).

Figure 7:
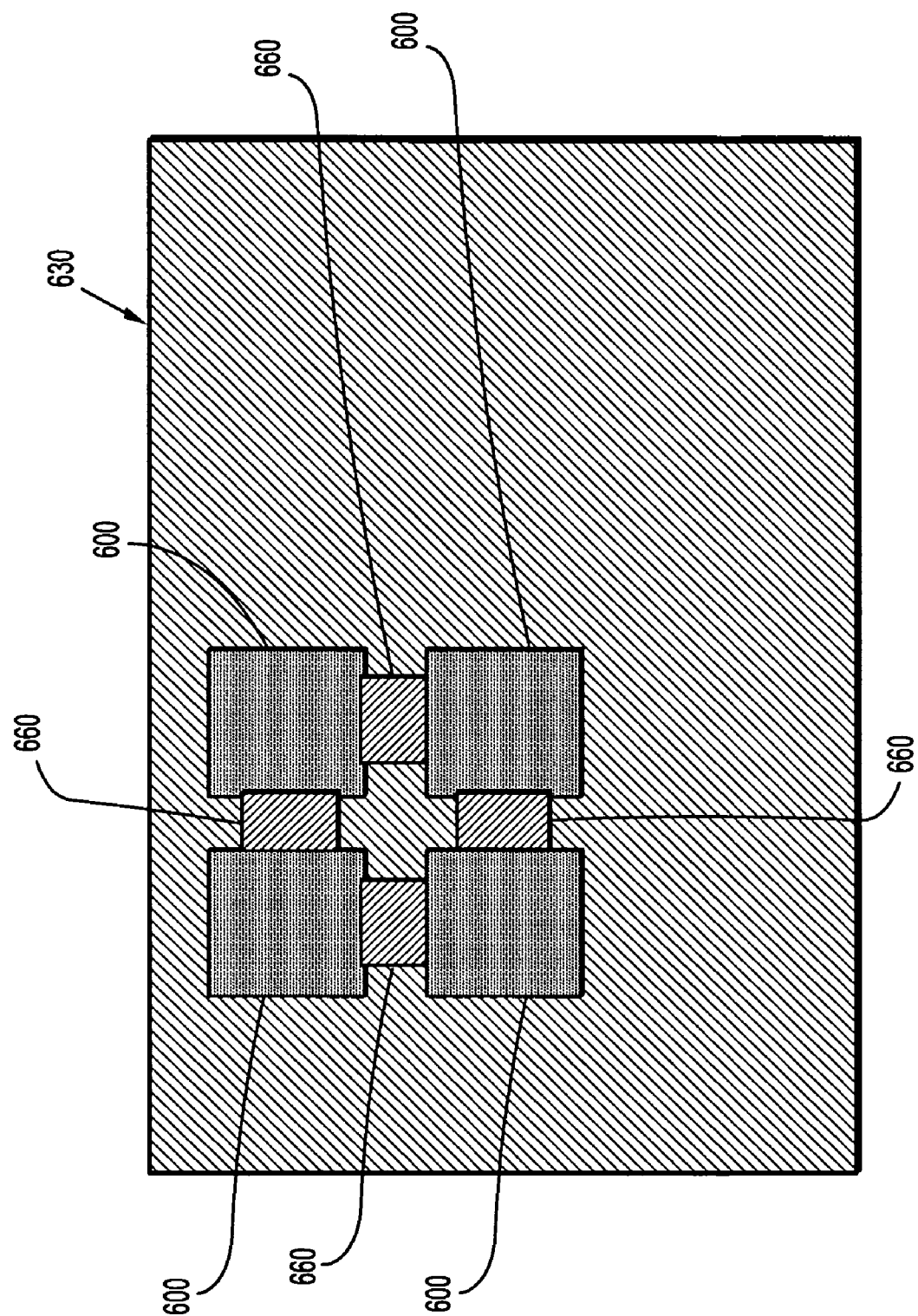
FIG. 7 schematically illustrates a top view of a node card having multiple packaging substrates attached using a local wiring network structure as in FIG. 6.

The wiring network structure (660) can be used to provide electrical connections between the chip module assembly (600) and other modules/components on the system board (630). For instance, FIG. 7 is a schematic top plan view of system board (630) (node card) having a plurality of MCM devices (600) commonly interconnected using local wiring network structures (660) (flex circuits or local fine pitch wiring). In the exemplary embodiment, the wiring network structures (660) are used as SMP (symmetric multi-processor) fabric connections between the chip module assemblies (600). The wiring network structures (660) may provide electrical connections to memory, or may provide direct connections to wiring on the circuit board (630).

It is to be understood that the general concepts described herein can be extended to include many combinations of pitch, not just the 1.0 mm and 0.5 or about 0.66 mm examples used. Additionally, any number of pitches could advantageously be utilized on the same module, and the pitch in the X & Y directions do not need to be the same. For example, three different pitches might be used where large diameter contacts on 1.27 mm centers might be used directly beneath the chip for power delivery, than a medium pitch, such as 1.0 mm could be used in areas more towards the edge of the module, and further a peripheral region of finer pitch contacts, such as 0.5 mm could be used around the edge of the module.

Although illustrative embodiments of the present invention have been described herein with reference to the accompanying drawings, it is to be understood that the invention is not limited to those precise embodiments, and that various other changes and modifications may be affected therein by one skilled in the art without departing from the scope or spirit of the invention. All such changes and modifications are intended to be included within the scope of the invention as defined by the appended claims.

What is claimed is:

1. An electronic apparatus, comprising:
   a first level package structure comprising a package substrate, one or more IC (integrated circuit) chips mounted on a first surface of the package substrate, and a first pattern of I/O contacts with pitch P1 formed on a second surface of the package substrate opposite the first surface;
   a second level package structure comprising a second pattern of I/O contacts with pitch P2, wherein P2 is not equal to P1; and
   an LGA (land grid array) interposer disposed between the first and second level package structures, wherein the LGA interposer provides space transform electrical interconnections between the first pattern and second pattern of I/O contacts, and further comprising a dummy contact formed on at least a first or second surface of the LGA interposer and aligned to an LGA contact on an opposing surface of the LGA interposer.

2. The apparatus of claim 1, wherein the package substrate comprises a third pattern of I/O contacts with pitch P2 formed on a second surface of the package substrate, wherein the third pattern of I/O contacts is aligned with I/O contacts in the second pattern of I/O contacts on the second level package structure, wherein the LGA interposer provides direct electrical connections between the third and second pattern of I/O contacts, and wherein the first pattern of I/O contacts is disposed in peripheral region of the second surface of the package substrate.

3. The apparatus of claim 1, wherein the LGA interposer, comprises:
   the LGA substrate having first and second opposing surfaces;
   a first pattern of LGA contacts formed on the first surface of the LGA substrate having a contact pitch P1 aligned to the first pattern of I/O contacts of the first level package structure; and
   a second pattern of LGA contacts formed on the second surface of the LGA substrate having a contact pitch P2 and aligned to the second pattern of I/O contacts of the second level package structure;
   wherein the LGA substrate includes redistribution wiring to provide space transform connections between at least some LGA contacts of the first pattern and second pattern of LGA contacts.

4. The apparatus of claim 3, wherein the LGA substrate is formed of a flexible non-conductive material and wherein the redistribution wiring includes metal wiring formed on at least one of the first and second surfaces of the LGA substrate.

5. The apparatus of claim 3, wherein the LGA substrate is a multilayer structure wherein the redistribution wiring is formed within the substrate.

6. The apparatus of claim 3, wherein the first and second LGA contacts are conductive elastomeric columns.

7. The apparatus of claim 3, wherein the first and second LGA contacts are non-conducting elastomeric columns with a conductive coating.

8. The apparatus of claim 3, wherein the second pattern of LGA contacts include solder contacts.

9. The apparatus of claim 3, wherein one or more LGA electrical contacts in the first pattern of LGA contacts are aligned to corresponding LGA contacts in the second pattern of LGA contacts and form straight through connectors.

10. The apparatus of claim 3, further comprising a support frame structure disposed around an outer perimeter of the package substrate and having first and second opposing surfaces, wherein the second surface of the support frame structure is coplanar with the second surface of the package substrate, and wherein the LGA interposer space transforms the first pattern of I/O contacts to I/O contacts of the second pattern of I/O contacts located near or under the second surface of the support frame.

11. An electronic apparatus, comprising:
   a package substrate having one or more IC (integrated circuit) chips mounted on a first surface of the package substrate and a first pattern of I/O contacts with pitch P1 and a second pattern of I/O contacts with pitch P2 formed on a second surface of the package substrate opposite the first surface;
   an electrical circuit board comprising a third pattern of I/O contacts with pitch P2, wherein P2>P1;
   a wiring network structure disposed on the electrical board having a fourth pattern of I/O contacts with pitch P1; and
   an LGA (land grid array) interposer disposed between the package substrate and the electrical circuit board, wherein the LGA interposer includes a first array of LGA contacts with pitch P2 providing direct electrical connections between the second and third patterns of I/O contacts and an array of second LGA contacts with pitch P1 providing direct electrical connections between the first and fourth patterns of I/O contacts.

12. The apparatus of claim 11, wherein the wiring network structure is a flexible circuit structure.

13. The apparatus of claim 11, wherein the wiring network structure is formed by local build up layers on the electrical circuit board.

14. The apparatus of claim 11, further comprising a dummy contact formed on at least the first or second surface of the LGA interposer and aligned to an LGA contact on an opposing surface of the LGA interposer.

* * * * *